United States Patent [19]
Hamel

[11] 3,943,383
[45] Mar. 9, 1976

[54] SUPERCONDUCTIVE CIRCUIT LEVEL CONVERTER

[75] Inventor: Harvey C. Hamel, Poughkeepsie, N.Y.

[73] Assignee: International Business Machines Corporation, Armonk, N.Y.

[22] Filed: Apr. 23, 1974

[21] Appl. No.: 463,327

[52] U.S. Cl. .............. 307/261; 307/262; 307/277; 307/306; 357/5
[51] Int. Cl.² .................. H03K 3/38; H03K 19/195
[58] Field of Search .......... 307/212, 277, 306, 262, 307/261; 357/5

[56] References Cited
UNITED STATES PATENTS

| | | | |
|---|---|---|---|
| 3,458,735 | 7/1969 | Fiske | 307/212 X |
| 3,758,795 | 9/1973 | Anacker et al. | 307/212 X |
| 3,764,863 | 10/1973 | Zappe | 357/5 |
| 3,803,459 | 4/1974 | Matisoo | 357/5 |

*Primary Examiner*—John Zazworsky
*Attorney, Agent, or Firm*—Harold H. Sweeney, Jr.

[57] ABSTRACT

A binary circuit is provided having a first and second Josephson device connected in series, each of the devices exhibiting a superconductive state and a resistive state. A first circuit is connected in parallel with said first device and has current flowing therein when said first device switches to said resistive state. A second circuit is connected in parallel with said second device and has current flowing therein when said second device switches to said resistive state. Each of these circuits has a common connection between the first and second Josephson devices. Control current means are provided associated with each of the Josephson devices for selectively switching said devices to said resistive state.

7 Claims, 6 Drawing Figures

FIG. 1
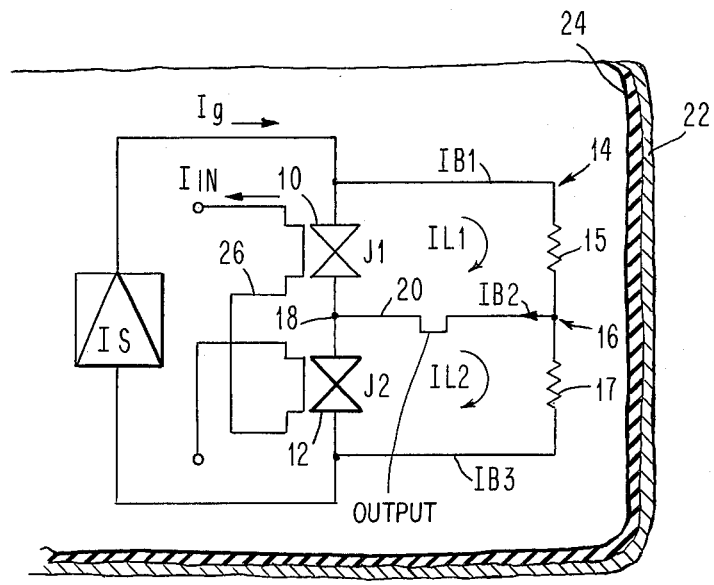
FIG. 2
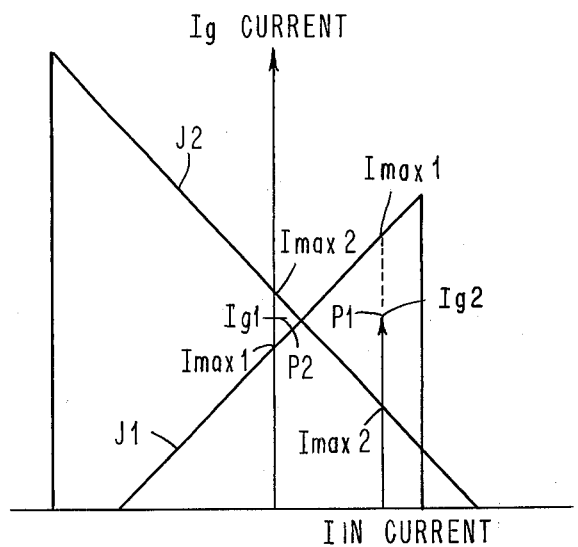
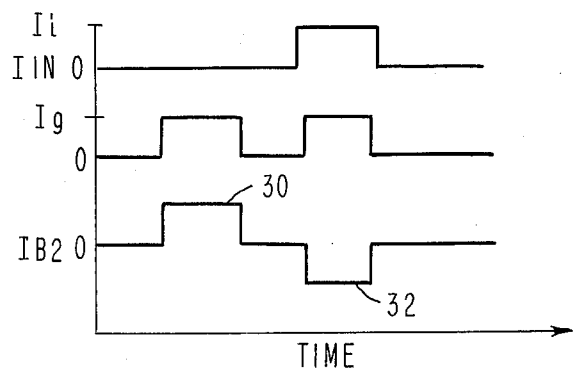
FIG. 3

3,943,383

SUPERCONDUCTIVE CIRCUIT LEVEL CONVERTER

FIELD OF THE INVENTION

The invention relates to a binary circuit using switching devices and more particularly, to superconductive circuitry utilizing Josephson tunneling devices capable of providing a bipolar output for a unipolar input.

DESCRIPTION OF PRIOR ART

Binary circuits can be used in all kinds of apparatus requiring a switching function for processing binary coded data. If the switching behavior of the circuits is bistable, memories, shift registers, counters, etc., can be easily designed. If the switching behavior of the circuits is monostable, they reset between each input signal. These binary switching circuits are useful to construct logical connective circuits and are especially useful, in this case, to provide a bipolar output for a unipolar input.

The term "superconductivity" means the complete disappearance of the electrical resistivity of a number of metals and alloys at very low temperatures near absolute zero. Superconductivity occurs suddenly below a certain temperature. This so-called critical temperature differs from material to material. It is known that electrons may be driven across a potential barrier between two conductors separated by a thin, non-conducting layer. The barrier is crossed by tunneling. Hence, this effect is called "the tunnelling effect." When the conductors are superconductive, single electrons may tunnel through such areas, whereby they overcome a potential difference corresponding to the value of the gap voltage. However, besides this single electron tunnelling effect there exists a further superconductive tunnelling effect involving bound electron pairs. In a superconductive metal, the prevailing charge carriers involved are electron pairs coupled with the lattice by the electron phonon interaction. Such electron pairs are called "Cooper pairs" after the scientist of that name. It has been predicted by B. D. Josephson, that a tunnelling effect involving Cooper pairs as carriers should occur between two adjacent superconductive metals separated by a sufficiently thin insulating layer. The insulating layer of material behaves like a superconductive metal in this Josephson tunnelling effect. With this kind of tunnelling, no potential difference is passed and, accordingly, no resistance is encountered by the current. The basic paper covering the Josephson tunnelling effect is the "Possible New Effects In Superconductive Tunnelling," published by B. D. Josephson in issue No. 7, Vol. No. 1 of the periodic Physic Letters, dated July 1, 1962 on pages 251 through 253. Generally the Josephson element or junction consists of a thin oxide barrier layer between two superconductive leads. At least one control line is provided for controlling the switching behavior of the element. The superconductive Josephson elements operate at a temperature of a few degrees kelvin and can take two different states depending on the passing current. In the region below the maximum Josephson current Imax, a Cooper pair tunnelling current is flowing. This is called "pair tunnelling," and the voltage drop across the element is zero. The element is in the superconductive state. When the current value Imax is exceeded the element switches to the other state, the finite voltage state. The current obtained is a tunnelling current which, however, involves essentially single charge carriers or quasi-particles. The particle tunnelling process is accompanied by a voltage drop caused by the tunnelling current, which voltage drop corresponds to the energy gap voltage Vg.

In the so-called finite voltage state of a Josephson element, the leads remain in the superconducting state, and a particle tunnelling current flows across the isolating interface. In Josephson elements a very small voltage drop occurs, which results in very little heat dissipation. When the current is reduced or removed after switching into the finite voltage state, a hysteresis effect occurs, i.e., resetting by changing to the superconducting state occurs at a current value considerably below the value Imax. The maximum Josephson current value Imax can be influenced by controlling magnetic fields applied by the current passing through the adjacent control lines. The maximum Josephson current value at which switching from the no voltage or superconducting state to the finite voltage state occurs can be varied by the design of the Josephson device.

Since Josephson elements can take two distinguishable states, they can be utilized in binary circuits. In U.S. Pat. No. 3,281,609, a superconductive switching element utilizing tunnelling effects is described. Input currents to be connected are applied through a Josephson junction. If the current flowing through the Josephson junction overcomes the maximum Josephson value, the junction switches to the finite voltage state. The resulting output current flows through a load resistance connected in parallel to the Josephson junction. U.S. Pat. No. 3,626,391 is an example of the application of Josephson elements to a memory application. The binary values are represented by the direction of circulating current in superconducting loops. Switching the current direction and sensing the storage value is effected by Josephson elements.

A paper by J. Matisoo, "The Tunnelling Cryotron — A Superconductive Logic Element Based on Electron Tunnelling" appears in the February 1967 issue of the Proceedings of the IEEE, issue No. 2, Vol. 55. This paper describes an application of Josephson elements as logic gates. It is concerned essentially with the switching behavior of a single element. It is suggested in one of the figures, that the current distribution in two branches of a superconducting loop can be controlled.

In U.S. Pat. No. 3,758,795, filed June 30, 1972 a binary logic circuit has been proposed which utilizes Josephson elements, whereby, a line terminated by its characteristic impedance is connected in parallel to a Josephson junction. In the superconducting state, the current flows essentially through the Josephson junction, but in the normal conducting state it flows through the parallel line. Subsequent elements can be controlled by the current in the line. However, this kind of a binary circuit is not capable of converting a binary unipolar input signal into a bipolar binary output.

Even with the knowledge of these superconducting Josephson tunnelling effects and its application to logic circuits and switching devices, it was not readily apparent how the Josephson tunnelling effect could be applied to reliable binary circuits, especially one that can convert the unipolar input signals into bipolar output signals. A coincident control pulse and timing pulse causes an output signal of one polarity, while a time pulse occurring alone causes an output signal of the other polarity.

Accordingly, it is the main object of the present invention to provide a binary circuit utilizing Josephson tunnelling devices to provide a bipolar output for a unipolar input.

It is another object of the present invention to provide a binary circuit using Josephson tunnelling devices which circuit is useful for the logical connection of binary coded data.

It is a further object of the present invention to provide a trigger circuit which can operate in response to pulses to give various outputs depending on design.

It is still a further object of the invention to provide Josephson tunnelling device circuits which can be easily fabricated using conventional planar technology.

BRIEF SUMMARY OF THE INVENTION

A binary circuit is provided having a first and second Josephson device connected in series, each of the devices exhibiting a superconductive state and a resistive state. A first circuit is connected in parallel with the first Josephson device and has current flowing therein when said first device switches to said resistive state. A second circuit is connected in parallel with said second device and has current flowing therein when said second device switches to said resistive state. Each of these first and second circuits has a common connection between the first and second Josephson devices. Control current means are provided associated with each of the Josephson devices for selectively switching said devices to said resistive state.

BRIEF DESCRIPTION OF THE DRAWINGS

FIG. 1 is a schematic illustration of a superconductive binary circuit of the invention utilizing Josephson tunneling devices;

FIG. 2 is a graph showing the gate current Ig versus the input current IIN for both Josephson junctions shown in FIG. 1;

FIG. 3 is a pulse diagram showing the input pulses and output pulses obtained in FIG. 1;

DETAILED DESCRIPTION OF THE PREFERRED EMBODIMENT

Figure 4:
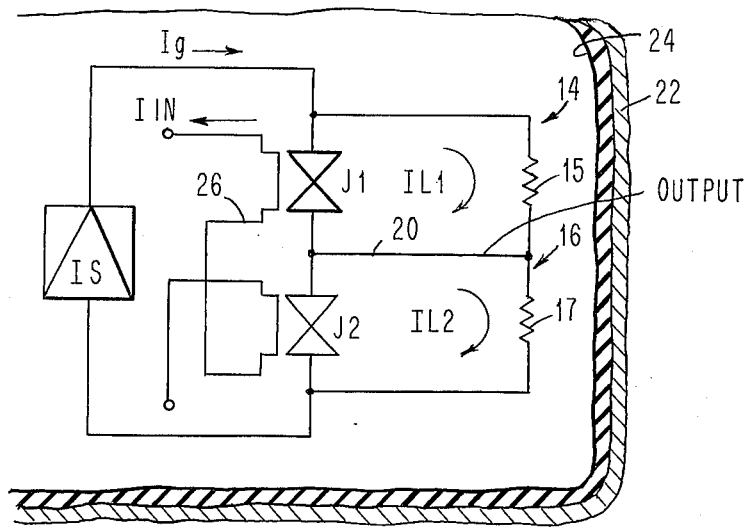
FIG. 4 is a schematic illustration of a superconductive binary circuit utilizing Josephson tunnelling devices having the Josephson devices connected serially in the reversed order.

FIG. 1 shows schematically the essential elements of the basic binary circuit of the invention. The superconductive circuit consists of a first and second Josephson device 10 and 12 connected in series. Each of the Josephson devices has a resistive circuit 14 and 16 connected therewith in parallel, respectively. It should be noted, that each of the parallel circuits 14 and 16 have a common connection 18 to the circuit between the Josephson junctions 10 and 12. In this case, the connection is made by a common line 20 of the two parallel circuits 14, 16. The circuit lines themselves are superconductive strip lines which are insulated from a superconductor ground plane 22 by insulation 24. The input to or control of the circuit is in the form of a superconductive stripline 26 which is arranged to pass in close proximity to the Josephson junctions J1 and J2 so as to electromagnetically effect the junction when a signal is carried thereby. It should be noted, that this input line 26 allows the input signals to pass in one direction across junction 10 and the other direction across the junction 12. The control line 26 does not have to be a continuous single line, as shown, but can be separately synchronized input lines, for each Josephson device. The gate current Ig for the Josephson series-connected devices is supplied by a current pulse source IS. The current carried by the control line 26 affects the Josephson device over which it passes by controlling the critical current at which the Josephson device switches from its no voltage to its finite voltage state. The control line 26 is not limited to a single line but can consist of several lines passing over the Josephson junction or junctions. The effect is the result of the combination of the several lines. These input lines can be combined and only a single control line allowed to pass over the Josephson junction with a signal thereon which is a combination of the signals of each of the plurality of separate lines. As can be seen in FIG. 1, the Josephson devices themselves are of different sizes. This is represented by the larger size junction 12 being of a darker representation than the junction 10. The different sizes provide Josephson devices having different critical current switching values giving the Josephson junction different switching points. It is possible that this same condition could be obtained by additional controlling currents, which could act on a single one or both of the Josephson elements. Probably the easiest way of obtaining Josephson junctions of different characteristics is to build it into the design. This can be done by utilizing Josephson junctions of different areas.

Figure 5:
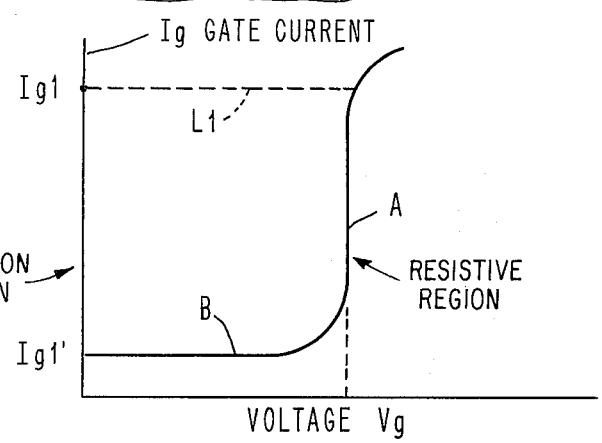
FIG. 5 is a graph showing the plot of gate current Ig versus voltage Vg.

Before proceeding to the operation of the circuit, the operation of a Josephson device or junction will be reviewed in connection with FIG. 5. This is a plot of Josephson junction gate current Ig through a Josephson tunnel junction plotted as a function of the voltage Vg across the junction. The plot shows the conventional curve denoting pair tunnelling through the junction in the zero voltage state and single particle tunnelling through the junction in the finite voltage state. That is, current up to a magnitude of Ig1 will flow through the junction in its zero voltage state. When current Ig through the junction exceeds this critical or maximum value Ig1, the junction will rapidly switch to a finite voltage state at which time the voltage across the junction will be the band gap voltage. This switching is denoted by dashed line L1 in FIG. 5. When current to the junction is decreased to a value less than Ig1, the voltage across the junction will follow the curve indicated by A and B back to the zero voltage state. Assume that the junction is in its zero voltage state and a current Ig equal to Ig1 flows through the device. If a sufficient magnetic field now couples to the junction through the control line such that the critical current value Ig1 falls to a value less than Ig, tunnel device J1 will immediately switch to a finite voltage state. If the current Ig is lowered such that it is less than Ig1, the tunnelling device will switch back to its zero voltage state.

The binary circuits of the present invention are built based on the characteristics of the Josephson devices. More particularly, the circuits depend on the switching ability of the Josephson tunnelling devices between the zero voltage state and the finite voltage state.

Referring now to FIG. 2, there is shown a graph plotting the current Ig versus the input current IIN applied to the Josephson junctions of the circuit of FIG. 1. The current gain characteristics of the Josephson junctions J1 and J2 are plotted. The current gain characteristic of junction J1 is shown increasing with an increase of current IIN, where IIN is plotted as the abscissa and Ig as the ordinate in the graph. Similarly, J2 is shown plotted on the graph as increasing in current Ig with a decrease in the input current IIN. Thus, the slopes of junction J1 and J2 are approximately opposite because of the opposite reaction thereto with respect to the opposite direction of IIN on the control line 26. It should also be noted, that the current gain characteristics of the two junctions are different due to the differing characteristics built into the devices such as difference of area of J2 with respect to J1. It can be seen, that with a gate current Ig1 from the current pulse source Is, and with no input current IIN, that the current value Ig1 is above the critical current value designated as Imax1 at which switching takes place for junction J1. Therefore, junction J1 is switched. Similarly, the current Ig1 is less than Imax2 for junction J2 and, accordingly, is below the gain characteristic curve for J2 which indicates that the junction J2 is not switched. The switched junction J1 is operating in the finite voltage state and the non-switched junction J2 is operating in the zero voltage state. Referring to FIG. 1, it can be seen that junction J1, if it is in the switched condition, has a finite voltage and, accordingly, current IL1 will flow through the branch circuit 14 which includes resistor 15. The current IB2 flowing through line 20 will serve as the output of the circuit and is shown as the positive pulse 30 in the bottom line of FIG. 3.

The situation where the input current IIN is applied as a positive current pulse concurrent with the gate pulse Ig, as shown in FIG. 3, the operating point P2 moves to P1 as shown in FIG. 2. With the simultaneous application of the input current IIN on the control line and the gate current Ig2, the critical current value Imax2 of J2 is exceeded causing it to switch into its finite voltage state. Similarly the critical current value Imax1 of junction J1 is not reached so that this junction remains in its zero voltage state. Accordingly, current IL2 flows in parallel circuit 16. In this condition, the current, when measured in line 20 will be flowing essentially in the opposite direction to the current flow in the above-discussed condition and, accordingly, a negative current pulse 32, shown in FIG. 3, results. In other words, there will be no current IL1 in the first parallel circuit since junction J1 is in its zero voltage state and, accordingly, is non-resistive. The gate current Ig will pass through junction J1 and will pass along line 20 since junction 12 is in its finite voltage state and presents a resistance to the flow of current. Current IL2 in the middle leg 20 of the two parallel circuits 14 and 16 is considered to be flowing in the negative direction and, accordingly, can be seen as the negative pulse 32 in IB2 of FIG. 3. By designing the two Josephson junctions J1 and J2 as shown in FIG. 2, the direction of the current IB2 in branch 20 can be controlled. If IIN is zero, J1 will switch but J2 will not. If IIN is equal to Ii, then J2 switches, but not J1. The appropriate timing of the circuits is shown in FIG. 3. The desired output is the current IB2 in the common middle branch 20. It should be noted that $$\left. \begin{array}{l} IL1 = -\dfrac{Vg}{R} \\ IL2 = 0 \\ IB2 = -\dfrac{Vg}{R} \end{array} \right\} \text{If J1 is switched.}$$

Also, it should be noted that $$\left. \begin{array}{l} IL1 = 0 \\ IL2 = \dfrac{Vg}{R} \\ IB2 = \dfrac{Vg}{R} \end{array} \right\} \text{If J2 is switched.}$$

where $Vg$ = the gap voltage of the respective Josephson junction. The output current from IB2 can now drive other circuitry.

FIG. 4 shows the same circuit as FIG. 1 except that the Josephson devices J1 and J2 are reversed in characteristics. Thus, a junction J1 has the current gain characteristic shown in FIG. 2 for J2. Similarly, junction J2 in FIG. 4 has the same characteristics as J1 shown in FIG. 2. When only the gate current pulse Ig is applied to the series-connected Josephson junctions J1 and J2 and no effective input control signal is present, Josephson gate J1 is in the superconducting state and Josephson gate J2 is in the finite voltage state. Thus, a current IL2 is developed in the second parallel circuit 16 which proceeds, in line 20, toward resistor 17, which is the direction selected to be negative. If the circuit has an effective input signal IIN applied to the control line 26, Josephson gate J1 switches to the finite voltage state, and Josephson gate J2 switches to the zero voltage state. In this situation, a current IL1 is developed in circuit 14 which proceeds in what has been selected as the positive direction in line 20 providing a positive output.

Figure 6:
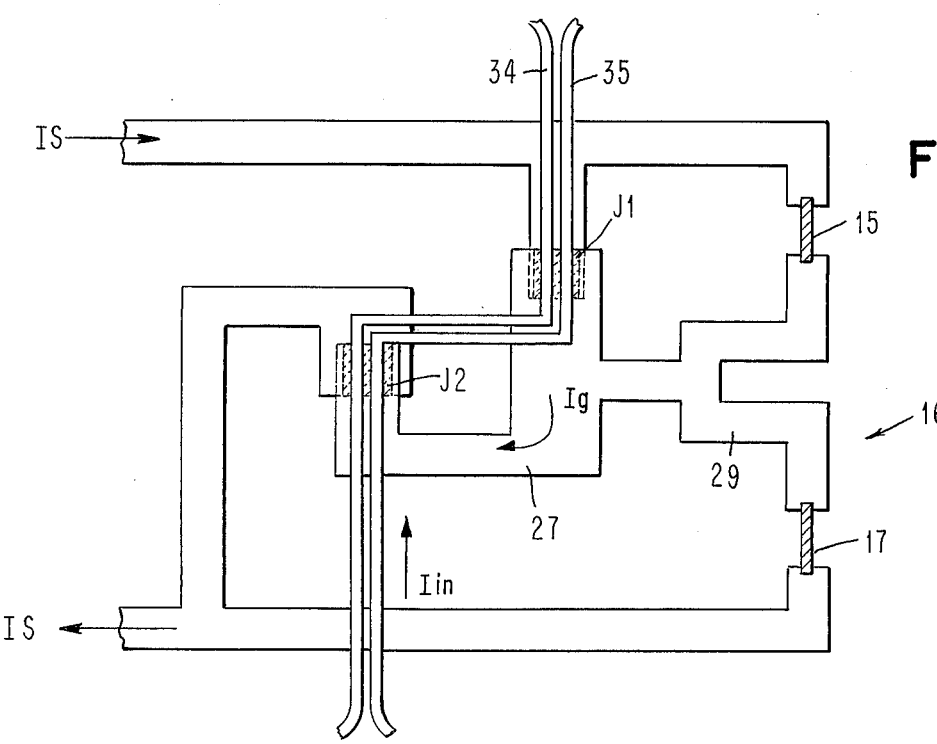
FIG. 6 is a diagram illustrating the structure of the circuit shown schematically in FIGS. 1 and 4.

FIG. 6 shows an example of how the circuit according to FIGS. 1 and 4 can be built utilizing integrated technology. Common parts are designated with the same reference characters. The circuit is arranged on a superconductive base plate or a ground plane 22 (not shown in FIG. 6). This ground plane may be of Niobium having a first isolating layer, for example, of Niobium oxide. Metal strip patterns are produced forming the superconductive leads and the electrodes of the Josephson junctions. These consist of the superconductive stripline extending from the current pulse source IS to the Josephson junction J1 as well as the lead extending to the upper end of the resistor 15. In the same metallization, the return stripline from the bottom of resistor 17 in the second parallel circuit 16 and the portion forming the bottom electrode of junction J2 and extending to the pulse source IS is formed. These metallizations may consist, for example, of lead alloys. The closely hatched areas of the drawing represent the oxide layers forming the insulator barriers for the junctions J1 and J2. A further metallization is utilized to complete the upper electrodes of the junctions and the circuitry connecting therefrom. For example, the inverted L-shaped part 27 and the tuning fork part 29 which extends to the resistors 15 and 17 are formed. In another step of the fabrication process the resistances 15 and 17 are evaporated from suitable materials. These superconductive striplines introduce inductance into the circuit. An isolating layer (not shown) covers the circuit, for example, silicon oxide. The control lines 34, 35 are then produced on top of the isolating layer.

FIG. 6 shows two control lines 34 and 35 rather than the one control line 26 as shown in FIGS. 1 and 4. Actually the number of control lines is limited only by the size of the junction which it overlays. It will be appreciated that the control lines can be combined into one so that the current inputs on the separate lines are combined in the single control line. Referring to the control lines in FIG. 6, it can be seen that they act in an opposite sense with respect to Josephson gates J1 and J2. For example, in the circuit of FIG. 1 the current in control line 26 is flowing parallel to the direction of the current through the Josephson junction J1 and in the opposite direction. However, the current direction is inverted in the control line of the Josephson gate J2 so that the current IIN flows parallel to the Josephson junction J2 but, in the same direction to the gate current Ig. In a practical design a control line forming loops is avoided, since a larger number of fabrication steps would be necessary to isolate the overlapping portions of the control lines. Instead, the part of the circuitry forming the upper electrode of the Josephson junctions J1 and the upper electrode of junction J2 is made in an inverted L-shape with the junction J1 at one end and the junction J2 at the other end. It can be seen from FIG. 6, that the control lines 34 and 35 cross over junction J1 in one direction and cross over junction J2 in the opposite direction because of the inversion of the junction J2 by the inverted L-shaped piece.

While the invention has been particularly shown and described with reference to preferred embodiments thereof, it will be understood by those skilled in the art that various changes in form and detail may be made therein without departing from the spirit and scope of the invention.

What is claimed is:

1. A binary circuit for converting unipolar coded data signals to bipolar data signals comprising:

a first and second Josephson element having a zero voltage state and a resistive state connected in series in the circuit;

a first resistive circuit connected in parallel with said first Josephson element and having current flowing therein when said first Josephson element switches to said resistive state;

a second resistive circuit connected in parallel with said second Josephson element and having current flowing therein when said second Josephson element switches to said resistive state;

said first and second resistive circuits having a common connection between said first and second Josephson elements;

control means for selectively switching said first and second Josephson elements to said resistive state; and said control means includes a current carrying conductor which is parallel to said first and second Josephson elements, the current through which flows in the same direction as current flowing through one of said first and second Josephson elements and flows in the opposite direction with respect to current flowing through the other of said first and second Josephson elements to produce opposite effects on said first and second Josephson elements.

2. A binary circuit according to claim 1, further including means for supplying electrical current to said Josephson elements.

3. A binary circuit according to claim 1, wherein said control means is common to said first and second Josephson elements.

4. A binary circuit according to claim 1, wherein said control means includes means for simultaneously placing one of said first and second Josephson elements in said resistive state and the other in said superconducting state.

5. A binary circuit according to claim 1, wherein said first and second Josephson elements exhibit different gain characteristics.

6. A binary circuit according to claim 2, wherein said means for supplying electrical current to said Josephson elements is a pulse source.

7. A binary circuit according to claim 5, wherein said different gain characteristics are achieved by providing different physical sizes of said first and second Josephson elements.

* * * * *